United States Patent [19]

Malotke et al.

[11] Patent Number: 4,964,810

[45] Date of Patent: Oct. 23, 1990

[54] RETAINING BAR FOR PRINTED WIRING CARDS

[75] Inventors: Timothy P. Malotke, Lino Lakes; Glendon D. Kappel, Brooklyn Park; Charles H. Marohl, Blaine, all of Minn.

[73] Assignee: NCR Corporation, Dayton, Ohio

[21] Appl. No.: 457,624

[22] Filed: Dec. 27, 1989

[51] Int. Cl.⁵ .......................................... H01R 13/639
[52] U.S. Cl. ..................................... 439/368; 361/415
[58] Field of Search ...................... 439/61, 62, 368, 86, 439/91, 927; 174/138 G; 361/415, 399, 413; 211/40, 41

[56] References Cited

U.S. PATENT DOCUMENTS

| | | | |
|---|---|---|---|
| 2,608,420 | 8/1952 | Eck | 280/179 |
| 3,001,102 | 9/1961 | Stiefel et al. | 174/52.1 X |
| 3,311,863 | 3/1967 | Beale | 339/45 |
| 3,774,939 | 11/1973 | Freads et al. | 280/179 B |
| 3,836,174 | 9/1974 | Holman, Jr. | 280/179 R |
| 4,051,549 | 9/1977 | Fiege | 361/415 X |
| 4,124,878 | 11/1978 | Ebner et al. | 439/368 X |
| 4,256,425 | 3/1981 | Burgess et al. | 410/149 |
| 4,332,515 | 6/1982 | Twyman | 410/149 |
| 4,555,744 | 11/1985 | Maroney et al. | 361/415 X |

OTHER PUBLICATIONS

"Air Bag", IBM Technical Disclosure Bulletin, vol. 11, No. 12 (May, 1969), p. 1694.
"Card Retention Scheme", IBM Technical Disclosure Bulletin, vol. 14, No. 9 (Feb., 1972), p. 2671.
NAVSEA 0957-LP-1640 Technical Manual for the AN/WQC-2 Underwater Communication Set, 12-0-8-89.

Primary Examiner—Steven C. Bishop
Attorney, Agent, or Firm—Wilbert Hawk, Jr.; Stephen F. Jewett; Jack R. Penrod

[57] ABSTRACT

An arrangement to provide a card cage of an electronic system with a retaining bar. The retaining bar simply and quickly latches in to holes drilled in the side of the card cage. Similarly, the retaining bar quickly unlatches from its holes to provide access for maintenance personnel. The retaining bar has a spring loaded latch element at each end of its length. It has a bar member with a U-shaped cross section in order to prevent excessive bending in the middle. The retaining bar further has a layer of resilient material between the U-shaped bar member and the printed wiring cards to provide a force against each card to retain it in its respective card position. The resilient material may be highly insulating or it may be anti-static as the technology requires.

12 Claims, 2 Drawing Sheets

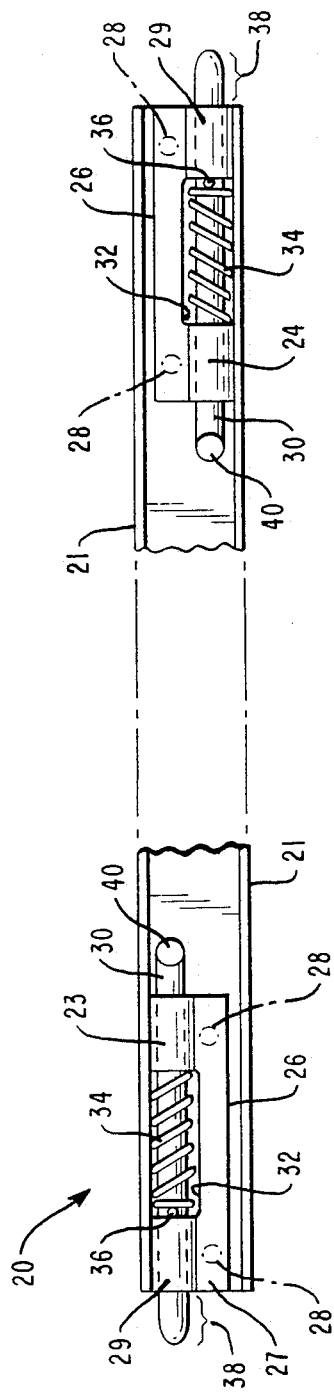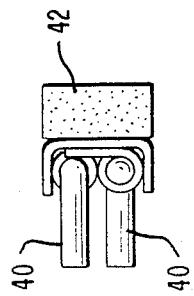

RETAINING BAR FOR PRINTED WIRING CARDS

BACKGROUND OF THE INVENTION

The present invention relates to electronic systems having card cages for printed wiring cards and, more particularly, to such systems having retainer bars to retain the printed wiring cards within their card cages.

A card cage may be used in an electronic system to hold printed wiring cards. Where they are used, card cages have a number of locations for cards that are commonly referred to as slots because of slotted guides that guide the cards into and out of their mating connectors. One (sometimes more) of the mating connectors are located at the bottom of each slot (if the cards are accessed from the top) or at the back (if the cards are accessed from the front). Each printed wiring card is inserted into its slot with enough force to insert the connector pins or conductors at the back of the printed wiring card into physical and electrical connection with its respective mating connector at the back or the bottom of the slot, as the case may be. The mating connectors have spring elements in each of their pin or conductor receptacles that are usually forced into tension by the insertion of its mating pin or conductor from the printed wiring card. Once the pins or conductors have been inserted into their respective receptacles, friction between the pins or conductors and their receptacles, as well as friction between the sides of the slot against the sides of the card, will usually hold the cards in the inserted position.

If the electronic system is subjected to periods of vibration, however, one or more of the printed wiring cards may be vibrated loose from its inserted position. If a printed wiring card is vibrated loose, the problem is that some of the same friction that held the card in position will now work against the card's return to the inserted position. Additionally, the force needed to re-insert pins or conductors that have vibrated loose from their spring tensioned receptacles typically can only be supplied by a human operator.

SUMMARY OF THE INVENTION

Briefly stated, there is provided, in accordance with the present invention, an arrangement to retain printed wiring cards within their card cage. The arrangement includes a retaining bar having a first latch at a first end thereof and a second latch at a second end opposite to the first end. The card cage has a first hole in one side of the front of the card cage for receiving an end of the first latch and a second hole in an opposite side of the front of the card cage for receiving an end of the second latch. When the retaining bar is latched into the holes in sides of the card cage, the retaining bar will traverse the front of the card cage in a direction that is transverse to the edges of the printed wiring cards mounted therein. Between the retaining bar and each of the printed wiring cards is a resilient member that is compressed as the retaining bar is installed, and as a result of being compressed, the resilient member exerts a force against each printed wiring card that retains that printed wiring card in its position in the card cage.

In particular, there is provided in accordance with the present invention an apparatus for retaining a plurality of printed wiring cards in operating positions within a card cage. The apparatus includes a bar member that has a first end and a second end along its longitudinal axis. The bar member has a first latch fastened at the first end and a second latch fastened at the second end. The bar member also has a resilient member attached along a longitudinal side which is closest to the printed wiring cards. The card cage has a pair of holes located on opposite sides of the front of the card cage. These holes receive the ends of the latches to affix the bar member across the front of the card cage in a position with the longitudinal axis of the bar member transverse to the edges of the printed wiring cards. With the ends of the latches inserted into their respective holes, the bar member and the resilient member attached thereto push against the edges of the printed wiring cards to retain them in their operating positions in the card cage.

It is, therefore, an object of the present invention to provide an arrangement with a bar member that simply latches into position across the front of the card cage to retain the printed wiring cards in their inserted positions during vibration.

It is another object of the present invention to provide a retainer bar arrangement that can be readily unlatched and remove from the front of the card cage to allow insertion or extraction of a printed wiring card.

Still a further object of the present invention is to provide an arrangement having a bar member with a resilient member that exerts a force on each of the printed wiring cards that retains each card in its respective position.

These and other objects of the present invention will be apparent from the following description of the preferred embodiment and the attached drawings.

BRIEF DESCRIPTION OF THE DRAWINGS

FIG. 2 is partially broken away front view of one of the bar members shown in FIG. 1.

FIG. 3 is an end view of the bar member shown in FIG. 2.

DESCRIPTION OF THE PREFERRED EMBODIMENT

Figure 1:
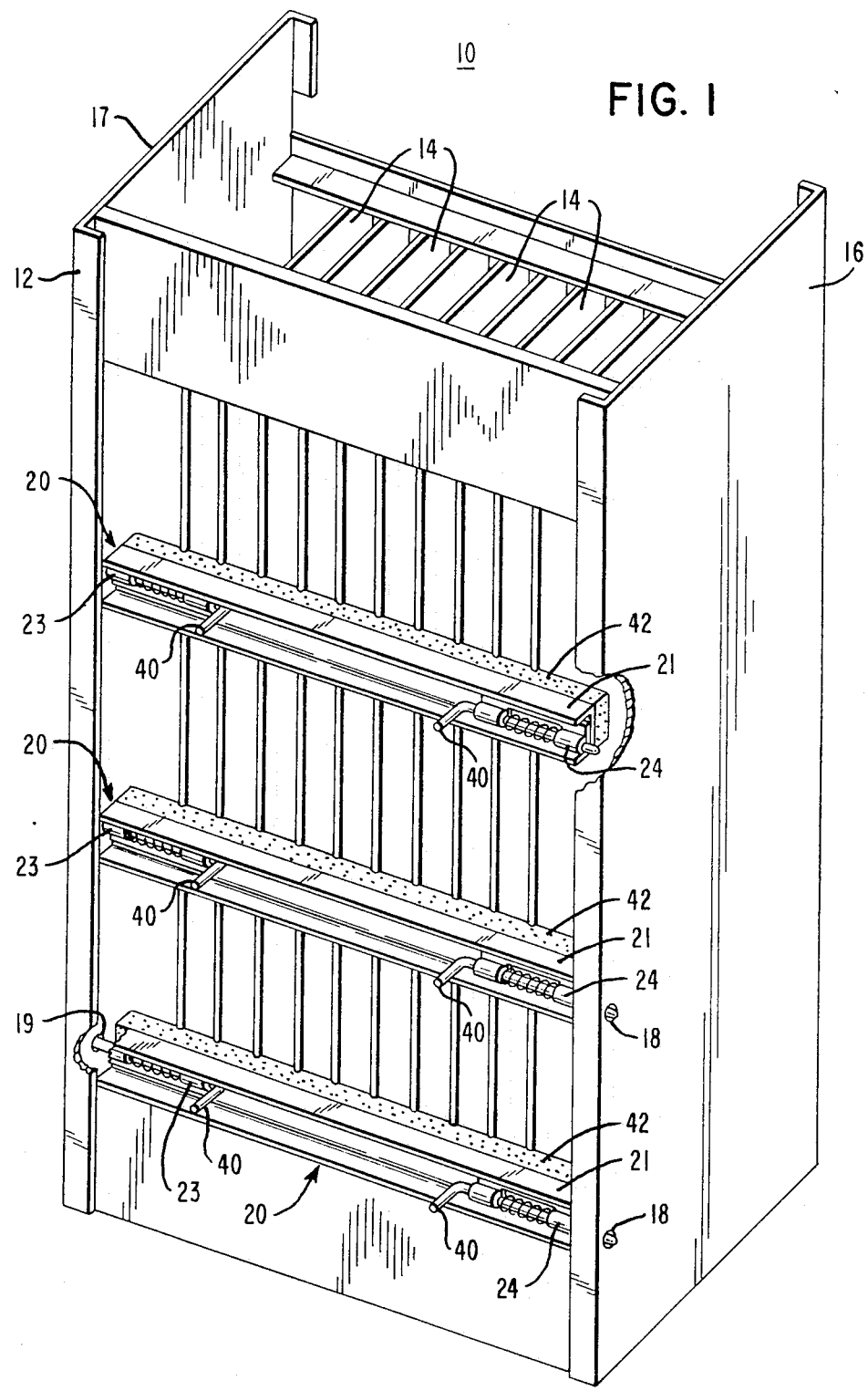
FIG. 1 is a perspective view showing a card cage with three retaining bar members installed according the present invention, with portions of the card cage and of one retaining bar broken away to reveal details of each.

REferring now to FIG. 1, a retaining arrangement 10 is shown, including a card cage 12 and a number of printed wiring cards 14 installed in the card cage 12. The card cage 12 has a slot (not shown) for each of the printed wiring cards 14. At the end of each slot is a mating connector (also not shown) that connects to a connector at the rear of each of the printed wiring cards 14. The slots provide lateral support for the printed wiring cards 14 to prevent them from moving side-to-side, and the connectors provide electrical connections from each of the printed wiring cards 14 to other printed wiring cards 14 or other parts of the system (not shown). Both the slots and the connectors are according to standard practices within the art and are not part of the present invention.

The card cage 12 has sides 16, 17 that provide lateral support for the card cage 12 and the printed wiring cards 14 therein. The sides 16, 17 are made of sheet metal for strength as well as electromagnetic shielding. The right side 16 has a number of holes 18 drilled or punched through the sheet metal, and the left side 17 has a similar number of holes 19 therein. The holes 18 and 19 all have parallel axis, and are arranged in pairs of one right side hole 18 and one left side hole 19 that are opposite to each other at approximately the same horizontal height. Each left side hole 19 is slightly higher than its respective right side hole 18 because latches 23, 24 (as will be shown in FIG. 2) are located on diagonally opposed portions of the retaining bar 20.

The preferred embodiment shown in FIG. 1, has three retaining bars 20 across the front opening of the card cage 12. Other embodiments may have more or fewer retaining bars 20 but these embodiments still would be deemed to be within the scope of the present invention.

Each retaining bar 20 includes a bar member 21, which is made from metal having a U-shaped cross section, in order to provide structural rigidity at all points along its length. Latches 23, 24 are located at the left and right ends, respectively, of a bar member 21.

Referring now to FIG. 2, the positioning of the left latch 23 and the right latch 24 on the bar member 21 is shown. The left latch 23 is located in the upper portion of the bar member 21, and the right latch 24 is located diagonally in the lower portion of the bar member 21. Each latch 23, 24 has a latch body 26. Each latch body 26 has a flat portion 27 that lies against the bar member 21 and is fastened thereto by resistance welds 28. Those skilled in the are will recognize that other types of fastening, such as rivets, machine screws, et cetera, are contemplated and are deemed to be within the scope of the present invention. Each latch body 26 also has a partly cylindrical portion 29. Each partly-cylindrical portion 29 has a hollow in which a cylindrical latch bolt 30 is secured to retaining bar 20. Also, each latch body 26 has a cutout 32 in the partly cylindrical portion 29, the purpose of which is explained below.

A spring 34 is mounted in each cutout 32 around each latch bolt 30. Each spring 34 bears against a side of its respective cutout 32 at one end. The second end of each spring 34 bears against the latch bolt 30, through a removable pin 36 or similar device projecting radially outward from the middle portion of the latch bolt 30, in order to resiliently bias the latch bolt 30 outwardly at the end of the bar member 21. The latch bolt 30 is supported in the latch body 26 such that an end portion 38 of each latch bolt 30 protrudes beyond its respective latch body 26 and its respective end of the retaining bar 20. Each end portion 38 protrudes sufficiently from its latch body 26 and its respective end of the bar member 21 to engage its respective hole 18,.19 (shown in FIG. 1) in which it is mounted. Furthermore, the'sizes of each cutout 32, each spring 34, and each end portion 38 are selected such that the end portion 38 of the latch bolt 30 may be retracted to a respective location which is flush with its respective end of the bar member 21. Retraction of both end portions 38 enables an operator to readily remove the retaining bar 20 for maintenance purposes.

Referring now to FIGS. 2 and 3, each of the latch bolts 30 has an handle portion 40 opposite to its end portion 38. The handle portions 40 allow the operator to readily retract the end portions 38 during both insertion and removal of the retaining bar 20. The end portions 38 may be rounded or tapered at their tips in order to assist each end portion 36 to be inserted in its respective hole 18, 19.

Referring to FIGS. 1 and 3, a layer 42 of resilient material is attached to a rear side of the bar member 21 that is opposite to the side on which the latches 23, 24 are fastened. The thickness of this layer is greater than a distance between the rear side of the bar member 21 and the front edges of the printed wiring cards 14. Thus, as the operator installs each retaining bar 20 into its holes 18, 19, each layer 42 of resilient material is elastically compressed by the edges of the printed wiring cards 14 such that the layer 42 will subsequently exert a force on each of the printed wiring cards 14 that maintains each card 14 in its installed position within its slot and mating connector. Any resilient material will function as the layer 42; however, for electrostatic discharge protection, the preferred embodiment of the invention uses an anti-static resilient foam, such as described in military specification Mil-B-18705B.

Thus, it will now be understood that there has been disclosed a retaining bar which maintains the printed wiring cards of an electronic system in their operating positions and properly connected to their mating connector.

As will be evident from the foregoing description, certain aspects of the invention are not limited to the particular details of the example illustrated, and it is therefore contemplated that other modifications or applications will occur to those skilled in the art, such as having retainer bars of different lengths, or having different types of latches. It is accordingly intended that the claims shall cover all such modifications and applications which do not depart from the true spirit and scope of the invention.

We claim:

1. An apparatus for retaining a plurality of printed wiring cards in operating positions within a card cage, comprising:

a bar member having a first and second ends along a longitudinal axis thereof;

a first latch fastened to the bar member at the first end;

said first latch is located along a first longitudinal edge of the bar member;

a second latch fastened to the bar member at the second end;

a second latch is located along a second longitudinal edge opposite to said first longitudinal edge of the bar member;

a resilient member attached to the bar member along the longitudinal axis thereof;

a card cage having a first and a second hole therein;

said first hole having a size selected to receive an end of said first latch, and having an axis that is transverse to the front edges of the printed wiring cards; and said second hole having a size selected to receive an end of said second latch, and having an axis that is parallel to and has a vertically spaced relationship with the axis of the first hole;

said second hole is located on a portion of the card cage opposite to that of the first hole;

whereby with the end of the first latch inserted into the first hole and the end of the second latch inserted into the second hole, the bar member and the resilient member attached thereto push against the edges of the printed wiring cards to retain the printed wiring cards in their operating positions in the card cage.

2. The apparatus according to claim 1, further comrpising:

a first spring connected to the first latch to provide a force to insert the end of the first latch into the first hole; and a second spring conencted to the second latch to provide a force to insert the end of the second latch into the second hole.

3. the apparatus according to claim 2, wherein the first latch and the second latch each has a handle such that their respective ends may be readily removed from the holes and the bar member readily lifted for maintenance.

4. The apparatus according to claim 2, wherein the bar member has a U-shaped cross section.

5. The apparatus according to claim 4, wherein the resilient member is made of an elastomeric foam.

6. The apparatus according to claim 4, wherein the resilient member is made of an anti-static, elastomeric foam.

7. An apparatus for retaining a plurality of printed wiring cards in operating positions within a card cage, comprising:
- a bar member having a first and second ends along its longitudinal axis;
- a first latch, including a latch bolt, a latch body, and a spring, is fastened to the bar member at the first end along a first longitudinal edge thereof;
- the latch bolt, the latch body and the spring cooperate such that in an extended position an end portion of the latch bolt protrudes beyond the first end of the bar member and in the retracted position does not protrude beyond the first end of the bar member;
- a second latch, including a latch bolt, a latch body, and a spring, is fastend to the bar member at the second end opposite the first end along a second longitudinal edge thereof opposite to said first longitudinal edge;
- the latch bolt, the latch body and the spring of the second latch cooperate such that in an extended position an end portion of the latch bolt protrudes beyond the second end of the bar member and in the retracted position does not protrude beyond the second end of the bar member;
- a layer of resilient material attached to the bar member along the longitudinal axis on a side of the bar member opposite to the first and second latches;
- a card cage having a first hole and a second hole therein;
- said first hole having a diameter selected to receive the end portion of the first latch, and having an axis that is transverse to the front edges of the printed wiring cards; and
- said second hole having a diameter selected to receive the end of the second latch, and having an axis that is parallel to and has a vertically spaced relationship with the axis of the first hole;
- said second hole is located on a portion of the card cage opposite to that of the first hole;
- whereby with the end portion of the first latch inserted into the first hole and the end portion of the second latch inserted into the second hole, the bar member and the layer of resilient material attached thereto push against the edges of the printed wiring cards to retain the printed wiring cards in their operating positions in the card cage.

8. The apparatus according to claim 7, wherein each spring is connected to its respective latch bolt at one end and bears against its respective body member at a second end to provide a spring force that inserts each end portion of each latch bolt into its respective hole.

9. The apparatus according to claim 7, wherein the latch bolts of the first and second latches each has a handle such that their respective end portions may be readily retracted from their respective holes and the bar member may be readily removed for maintenance.

10. The apparatus according to claim 7, wherein the bar member has a U-shaped cross section.

11. the apparatus according to claim 7, wherein the layer of resilient material is made of an elastomeric foam.

12. The apparatus according to claim 7, wherin the layer of resilient material is made of an anti-static, elastomeric foam. wherein the layer of resilient material is made of an anti-static, elastomeric foam.

* * * * *

UNITED STATES PATENT AND TRADEMARK OFFICE
CERTIFICATE OF CORRECTION

PATENT NO. : 4,964,810

DATED : October 23, 1990

INVENTOR(S) : Timothy P. Malotke et al.

It is certified that error appears in the above-identified patent and that said Letters Patent is hereby corrected as shown below:

Column 4, line 41, "a second" should be --said second--.

Column 5, line 1, "conencted" should be --connected--.

Column 5, line 4, "the" should be --The--.

Column 6, line 35, "the" should be --The--.

Column 6, line 38, "wherin" should be --wherein--.

Column 6, line 40, "wherein the layer of resilient material is" should be deleted.

Column 6, line 41, should be deleted.

Signed and Sealed this

Twenty-first Day of July, 1992

*Attest:*

DOUGLAS B. COMER

*Attesting Officer*     *Acting Commissioner of Patents and Trademarks*